US006533588B1

(12) United States Patent
Woith et al.

(10) Patent No.: US 6,533,588 B1
(45) Date of Patent: Mar. 18, 2003

(54) CONNECTOR ASSEMBLY FOR FLEXIBLE CIRCUITS

(75) Inventors: Blake F. Woith, Santa Ana, CA (US); Leslie Ann Hardie, Lake Forest, CA (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/538,988

(22) Filed: Mar. 30, 2000

(51) Int. Cl.[7] ........................... H01R 12/00; H05K 1/00

(52) U.S. Cl. ......................... 439/67; 439/289; 439/609; 439/447

(58) Field of Search .......................... 439/609, 67, 289, 439/77, 447, 939, 284, 496, 378

(56) References Cited

U.S. PATENT DOCUMENTS

| | | | | | |
|---|---|---|---|---|---|
| 3,871,744 | A | * | 3/1975 | Bridger et al. | 350/96 C |
| 4,060,889 | A | * | 12/1977 | Zielinski | 29/628 |
| 4,529,257 | A | * | 7/1985 | Goodman et al. | 439/271 |
| 4,834,660 | A | * | 5/1989 | Cotti | 439/67 |
| 5,044,980 | A | * | 9/1991 | Krumme et al. | 439/496 |
| 5,080,595 | A | * | 1/1992 | Mouissie | 439/67 |
| 5,123,852 | A | * | 6/1992 | Gillett | 439/67 |
| 5,133,667 | A | * | 7/1992 | Daughtrey | 439/67 |
| 5,207,887 | A | | 5/1993 | Crumly et al. | 205/78 |
| 5,248,261 | A | * | 9/1993 | Conroy-Wass et al. | 439/67 |
| 5,266,053 | A | * | 11/1993 | Jamet et al. | 439/607 |
| 5,295,838 | A | | 3/1994 | Walen et al. | 439/67 |
| 5,364,277 | A | | 11/1994 | Crumly et al. | 439/67 |
| 5,451,169 | A | | 9/1995 | Corbett, III et al. | 439/289 |
| 5,742,484 | A | | 4/1998 | Gillette et al. | 361/789 |
| 5,876,215 | A | | 3/1999 | Biernath et al. | 439/67 |
| 5,967,833 | A | | 10/1999 | Cachina | 439/499 |
| 5,971,811 | A | * | 10/1999 | Mori et al. | 439/675 |
| 5,975,934 | A | * | 11/1999 | Ichimura | 439/260 |
| 6,010,359 | A | * | 1/2000 | Etters et al. | 439/496 |
| 6,123,551 | A | * | 9/2000 | Westfall | 439/67 |

* cited by examiner

*Primary Examiner*—Javaid Nasri
(74) *Attorney, Agent, or Firm*—Thomas N. Twomey

(57) ABSTRACT

A flex connector assembly is provided having a plug assembly and a receptacle assembly for electrically connecting with the plug assembly. The plug assembly includes a plug housing, a first plug interface surface and a plug flex connector having a first portion with a plurality of conductive protrusions thereon, wherein the plug flex connector is fixed in the plug housing such that the conductive protrusions are positioned on the first plug interface surface. The receptacle assembly includes a receptacle housing, a first receptacle interface surface and a receptacle flex connector having a plurality of conductive protrusions thereon, wherein the receptacle flex connector is fixed in the receptacle housing such that the conductive protrusions are positioned on the first receptacle interface surface. The conductive protrusions of the plug assembly are aligned to contact conductive protrusions on the receptacle assembly when the plug assembly and receptacle assembly are connected. To provide EMI and RFI shielding, the housing of the plug and receptacle assemblies are preferably made of conductive metallic material.

29 Claims, 10 Drawing Sheets

CONNECTOR ASSEMBLY FOR FLEXIBLE CIRCUITS

BACKGROUND OF THE INVENTION

The present invention generally relates to the field of circuit board connectors and more particularly relates to a flex connector for making high speed, high density, shielded, electrical interconnections.

In electronic systems using printed circuit boards or flexible (flex) circuits, it is necessary to provide electrical connector assemblies to make a variety of electrical interconnections. The complexity of many printed circuit substrates and the space constraints present in many electronic systems require electrical connector assemblies capable of making a large number of interconnections in a limited space. An electrical connector assembly typically includes a pair of connector structures that interface with one another to form a plurality of electrical interconnections. Each connector structure must be capable of making a large number of interconnections to an interface on a printed circuit substrate. In addition, the connector structures ordinarily must be made separable from one another to enable the printed circuit substrates to be disconnected and exchanged for upgrade, repair or modification.

Many existing separable connector assemblies use a large number of metal pins of various designs to interface between the connector structures and printed circuit substrates. The pins are electrically coupled to conductive contacts on each connector structure. When a connector structure is engaged with another connector structure to form a separable connector assembly, the contacts interface with additional contacts on the other connector structure. The pins typically are surface-mounted to pads or soldered into plated thru holes on the printed circuit substrate on which the connector structure is mounted. The pins and pads are electrically and mechanically connected with solder. The pads are electrically coupled to one or more conductive traces on the printed circuit substrate. The solder electrically interconnects the contacts on the connector structure and the traces on the printed circuit substrate via the metal pins. The use of separable connector assemblies having metal pins has been recognized as a standard way to interface with printed circuit substrates. However existing separable connector assemblies using metal pins suffer from a number of disadvantages.

For example, in many connector assemblies, the pins include a bent portion that extends beyond the periphery of the connector structure to engage a pad on the printed circuit substrate. The extension of the pin beyond the periphery of the connector structure increases the amount of substrate surface area required by the connector assembly, and thus the footprint of the connector assembly is increased. The extension of the pin also increases the length of the electrical signal path between the contacts on the connector structure and the traces on the printed circuit substrate. In addition, the bent portion of the pin can act as a lever arm during engagement and disengagement of the connector assembly, applying stresses that can damage the solder joints formed with the pads.

Moreover, at higher interconnection densities, the metal pins must be made with smaller sizes and smaller pitch to fit a larger number of interconnections within a given space. The production of reduced pin sizes dictated by aggressive spacing requirements can be very costly and tests the limits of present manufacturing capabilities. Even if manufacturing capabilities exist, however, the reduced size tends to produce structurally weak pins that are easily damaged. In addition, the reduced pitch and size complicate both alignment of the pins with the pads, and the placement of the pins within the connector structure.

Finally, for the traditional pin and socket connector assembly to provide high speed electrical connection, each individual pin and socket must be shielded against electromagnetic interference (EMI) and radio frequency interference (RFI). The shielding process creates an extremely bulky product that may not fit within the confines of the space available to make such connections.

The disadvantages associated with existing connector assemblies demonstrate a need for an improved connector for making high speed, high density, shielded, impedance controlled electrical interconnections. Specifically, there is a need for a connector that is capable of making a large number of interconnections in a limited space while still maintaining a high speed, low noise connection. Moreover, there is a need for a connector that is mechanically able to minimize deformation caused by stress applied to the connector surface. In addition, there is a need for a connector that provides for EMI and RFI shielding without significantly increasing the bulk of the connector itself.

SUMMARY OF THE INVENTION

The flex connector assembly of the present invention overcomes the disadvantages of the prior electric connectors.

A flex connector assembly is provided having a plug assembly and a receptacle assembly for electrically connecting with the plug assembly. The plug assembly includes a plug housing, a first plug interface surface and a plug flex circuit having a first portion with a plurality of conductive protrusions thereon, wherein the plug flex circuit is fixed in the plug housing such that the conductive protrusions are positioned on the first plug interface surface. The receptacle assembly includes a receptacle housing, a first receptacle interface surface and a receptacle flex circuit having a plurality of conductive protrusions thereon, wherein the receptacle flex circuit is fixed in the receptacle housing such that the conductive protrusions are positioned on the first receptacle interface surface. Each of the conductive protrusions of the plug assembly are aligned to contact one of the conductive protrusions of the receptacle assembly when the plug assembly and receptacle assembly are connected. To provide EMI and RFI shielding, the housing of the plug and receptacle assemblies are preferably made of conductive metallic material or from a metallized material.

The flex connector assembly of the present invention can be used to make electrical connections in a variety of electronic equipment, including, but not limited to, computers, Internet boxes, telephone switching gear and video monitors. The use of conductive protrusions allows the flex connector to make a large number of electrical interconnections in a limited space. Moreover, the conductive protrusions are resistive to mechanical deformation caused by stress applied to the connector surface.

DESCRIPTION OF THE DRAWINGS

Other features and advantages of the invention will become apparent upon reading the following detailed description of the invention and upon reference to the drawings in which.

DETAILED DESCRIPTION OF THE INVENTION

Figure 1:
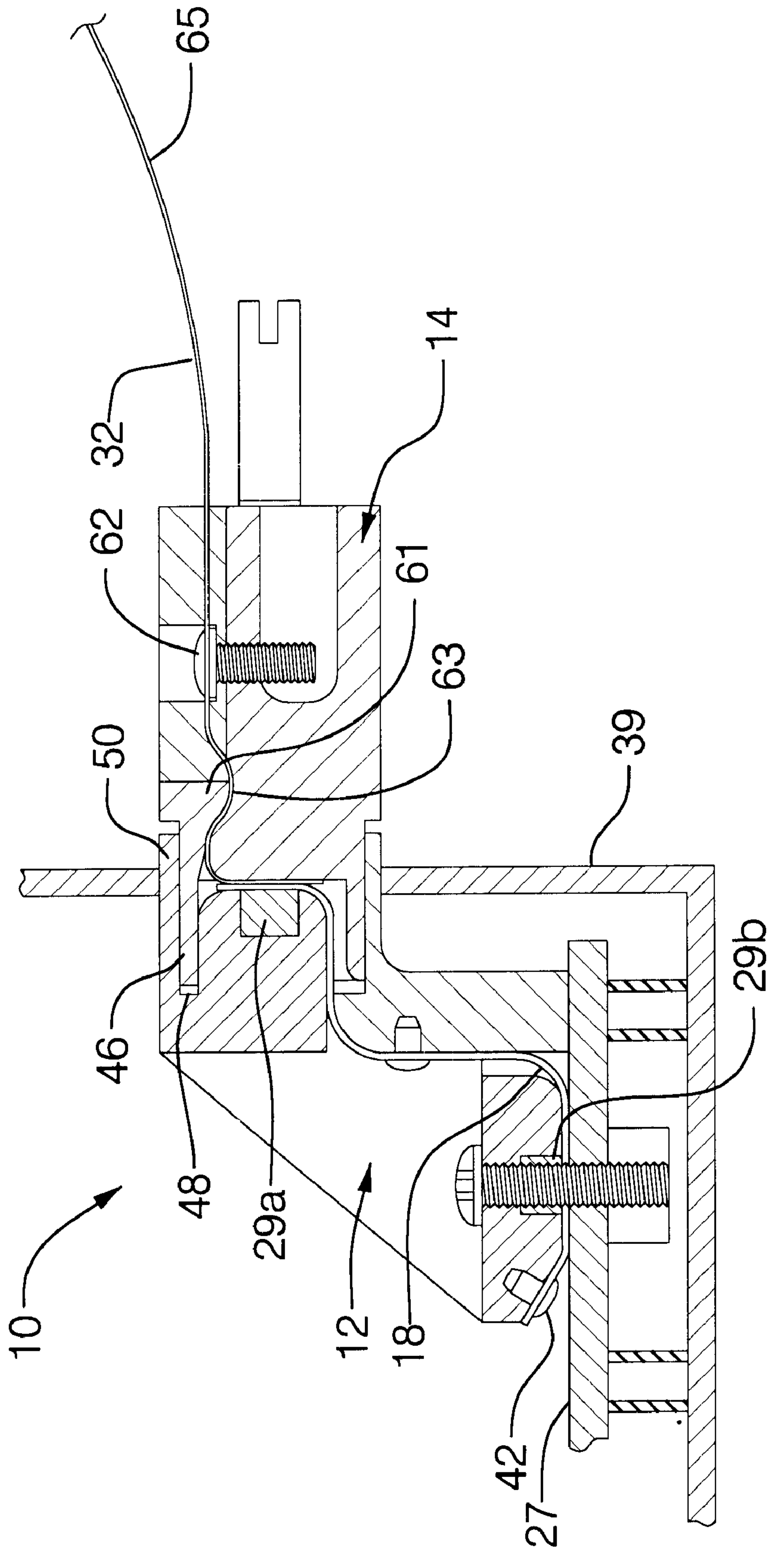
FIG. 1 is a cross-sectional view of an embodiment of the plug and receptacle assemblies of the present invention in a connected state.
Figure 2:
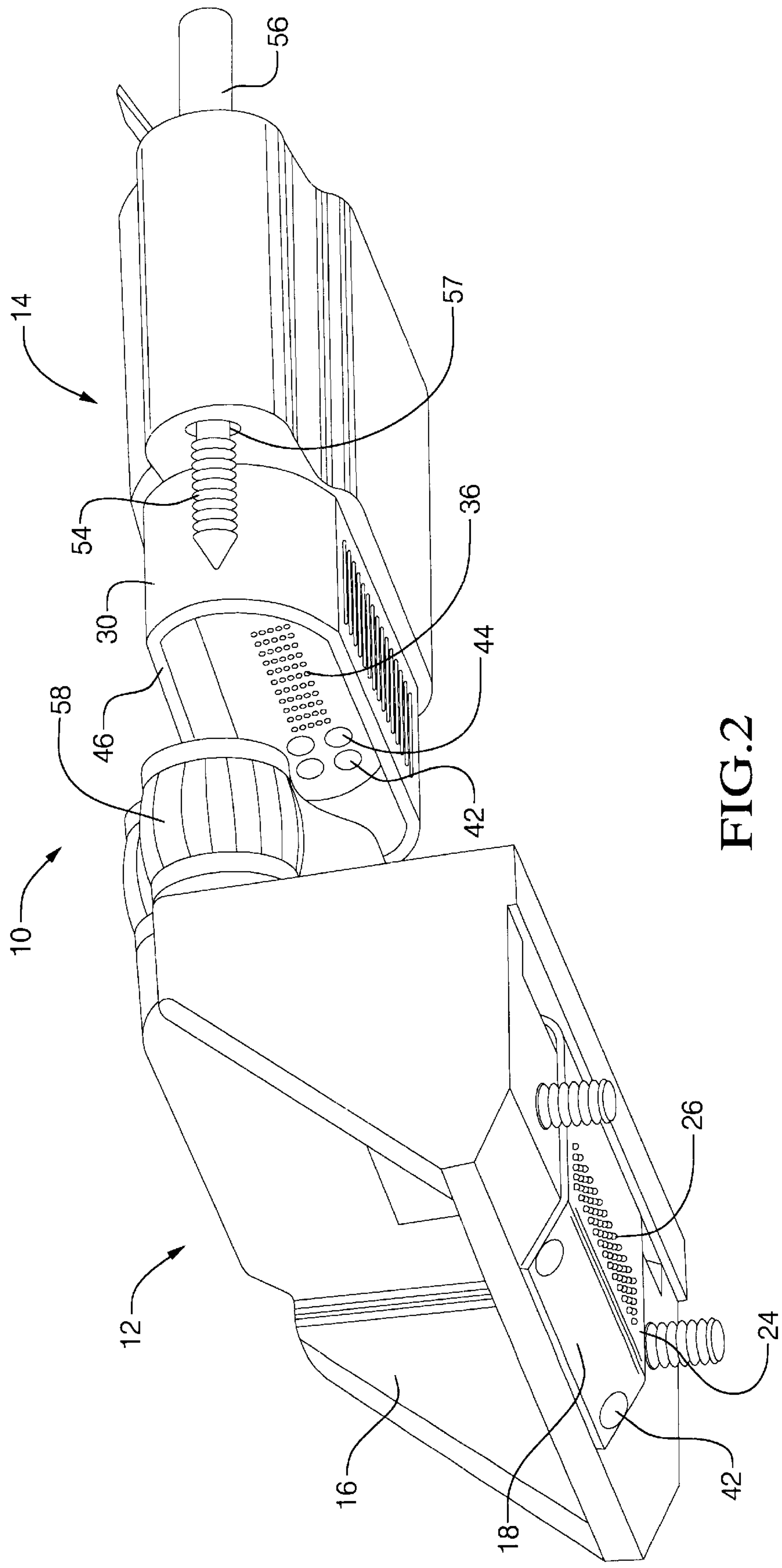
FIG. 2 is an elevated perspective view of the plug and receptacle assemblies of one embodiment of the present invention in an unconnected state.

FIGS. 1 and 2 illustrate one embodiment of the flex connector assembly 10 of the present invention. The flex connector assembly 10 includes a receptacle assembly 12 and a plug assembly 14 that are dimensioned to mechanically and electrically connect to each other. The receptacle assembly 12 is typically mounted on a chassis 39 such as for example on an Internet switch box or computer chassis. FIG. 1 depicts the flex connector assembly in a connected state and FIG. 2 depicts an embodiment of the flex connector assembly in an unconnected state.

Figure 3:
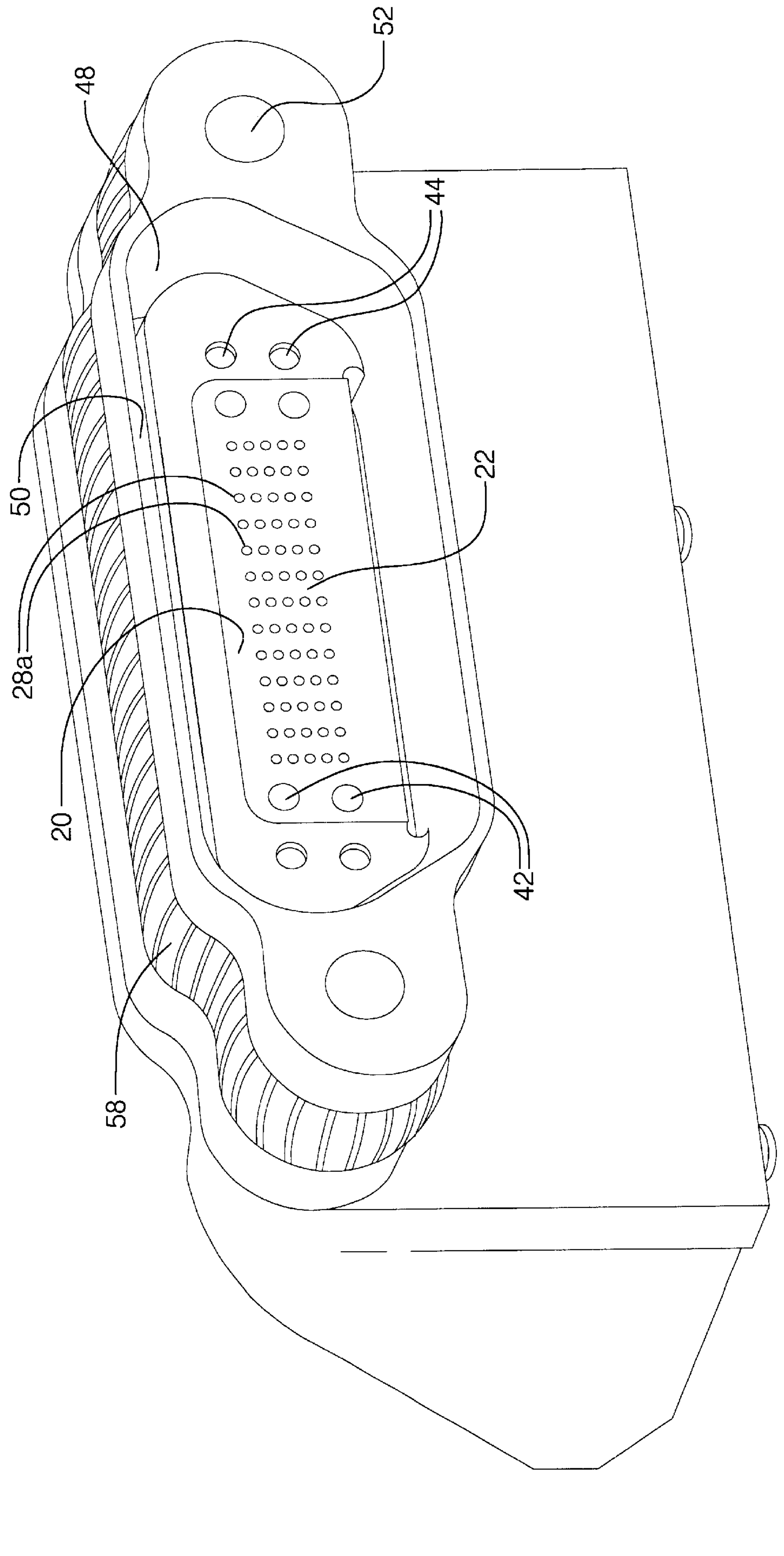
FIG. 3 is a front perspective view of the receptacle assembly of one embodiment of the present invention.
Figure 4:
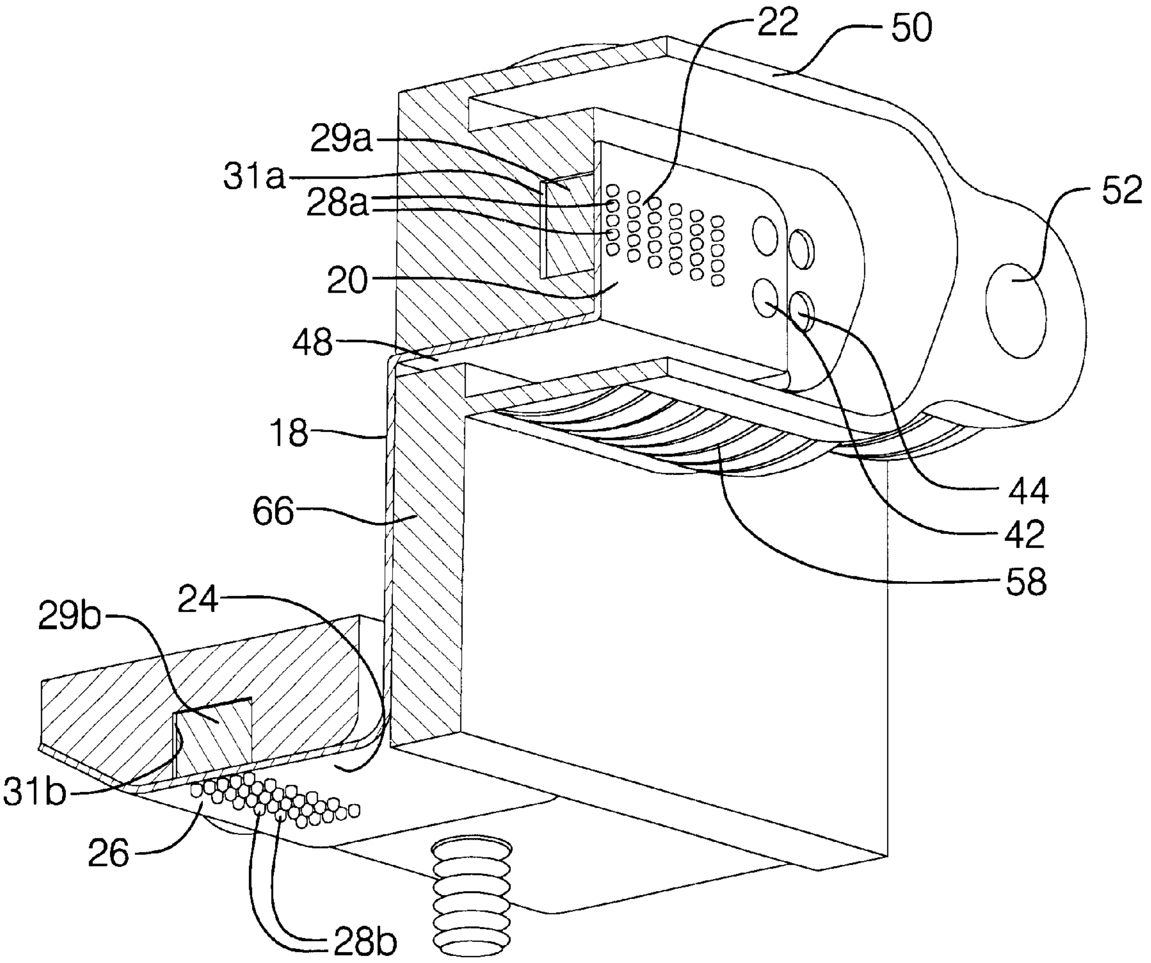
FIG. 4 is a cross-sectional perspective view of the receptacle assembly of one embodiment of the present invention.

As best shown in FIGS. 2 through 4, the receptacle assembly includes a receptacle housing 16 and a receptacle flex circuit 18 coupled to the receptacle housing 16. The receptacle flex circuit 18 has a first portion 20 that defines a first receptacle interface surface 22 and a second portion 24 that defines a second receptacle interface surface 26. In a preferred embodiment, conductive protrusions 28*a*, 28*b* are disposed on the first and second receptacle interface surfaces 22, 26, respectively, for making electrical contacts. Each of the conductive protrusions 28*a* on the first receptacle interface surface 22 are electrically coupled to a respective conductive protrusion 28*b* on the second receptacle interface surface 26. The conductive protrusions 28*a*, 28*b* are preferably arranged in an array format. The number and arrangement of the conductive protrusions can vary depending on the application.

Figure 5:
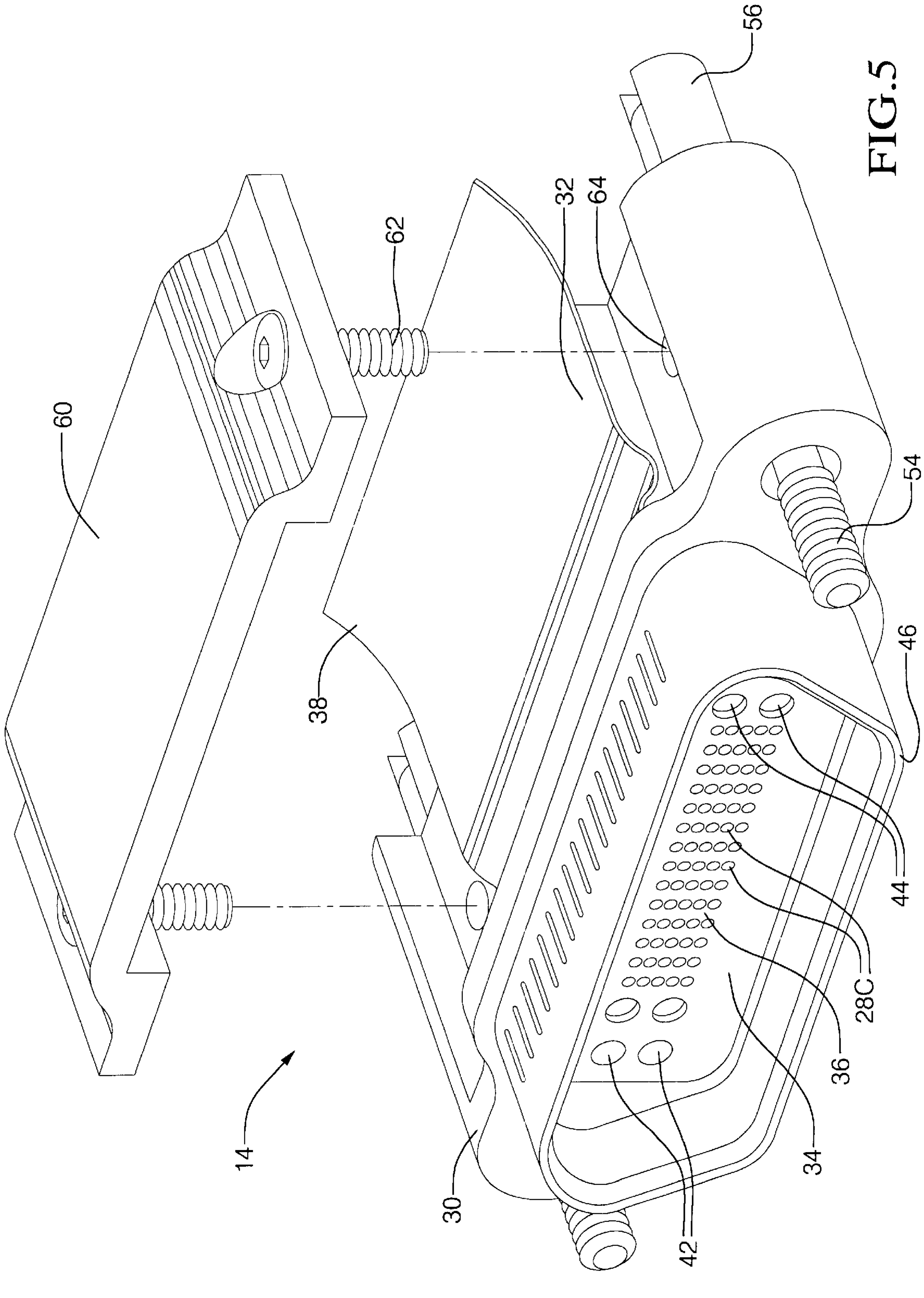
FIG. 5 is perspective view of the plug assembly of one embodiment of the present invention having a cover shown in an unattached state.

Similarly, as best shown in FIG. 5, the plug assembly 14 includes a plug housing 30 and a plug flex circuit 32 coupled to the plug housing 30. The plug flex circuit 32 has a first portion 34 that defines a first plug interface surface 36. Conductive protrusions 28*c* are disposed on the first plug interface surface 36 for making an electrical interconnection with the receptacle assembly 12. The plug flex circuit 32 has a second portion 38 that is electrically connectable with an electric circuit of an electrical device. In the preferred embodiment, the electrical interconnection between the plug and the electric circuit is made through conductive protrusions disposed on a second portion 38 of the plug flex circuit 32. With this embodiment, each of the conductive protrusions 28*c* on the first plug interface surface 36 are electrically coupled to a respective electrical contact (not shown) on the second portion 38 of the plug flex circuit 32.

In the preferred embodiment, conductive protrusions 28*a*, 28*b*, 28*c* are disposed on interface surfaces 22, 26, and 36, respectively, for making electrical interconnections. The conductive protrusions 28 are preferably arranged in an array format. The number and arrangement of the conductive protrusions can vary depending on the application.

The conductive protrusions 28*a* on the first receptacle interface surface 22 are aligned to be electrically and mechanically connected to the plug assembly 14, as will be discussed fully below. The conductive protrusions 28*b* of the second receptacle interface surface 26 are aligned to be electrically and mechanically connected to the electrical traces of an electrical circuit or flex board 27 (FIG. 1).

The conductive protrusions 28*c* on the first plug interface surface 36 are aligned to be electrically and mechanically connected to the conductive protrusions 28*a* on the first receptacle interface surface 22 of the receptacle assembly 12. The electrical contacts of the second portion 38 of the plug flex circuit 32 are aligned to be electrically and mechanically connected to the electrical traces of an electrical circuit or printed circuit board. When all of the electrical interconnections are made, there will be electric flow from a first circuit or flex board 27 to the receptacle assembly, from the receptacle assembly to the plug assembly, and from the plug assembly to a second circuit or printed circuit board. In this manner, the flex connector assembly 10 electrically connects a first electrical device to a second electrical device. Preferably, an elastomer pad 29*a*, such as a silicon rubber pad, is fitted within a groove 31 a in the receptacle housing 16 behind the set of conductive protrusions 28*a*. Similarly an elastomer pad 29*b* is fitted within a groove 31*b* in the in the receptacle behind the set of conductive protrusions 28*b*. The elastomeric pads provide planarization to the conductive protrusions and ensure that all the protrusions of each set will make full contact with other contacts, e.g., the protrusions 28*a* and the electrical traces of the circuit board 27, with which they will mate against. An elastomeric pad may also be fitted in a groove (not shown) formed as the plug housing behind the set of protrusions 28*c*.

The conductive protrusions 28 are preferably formed on the flex circuits 18 and 32 using an electroplating process. In the preferred embodiment, the conductive protrusions 28 include a copper layer coated with a gold layer. The copper provides the structural integrity of the conductive protrusion. Furthermore, the conductivity of copper ensures conduction of the electric trace during the connection. Moreover, the copper provides protection to the signal traces from EMI/RFI interference by being grounded via rivets which attach the flex circuit to the plug and receptacle housings. The gold layer provides a low resistance interconnect. Accordingly, in the preferred embodiment, the conductive protrusions 28 are in the form of dots and include a body of copper material and a coat of gold. Other conductive materials, such as silver, palladium, tin or an alloy, can also be used. The shape and dimension of the conductive protrusions are chosen such that an enduring electrical connection is attainable between a pair of mated conductive protrusions 28. Specifically, in the preferred embodiment, the conductive protrusions 28*a* on the first receptacle interface surface 22 are cone shaped, having a wide base and a pointed tip. The corresponding conductive protrusions 28*c* located on the first plug interface surface 36 are pad-shaped. The conical shaped conductive protrusions 28*a* provide penetrating contact on the pad-shaped conductive protrusions 28*c* ensuring a secure mechanical and electrical connection. Also, the conductive protrusions 28*b* on the second receptacle interface surface 26 are preferably conical shaped and dimensioned to interact with pad-shaped conductive protrusions provided on the circuit board to be connected with the receptacle assembly 10. In the preferred embodiment, the conductive protrusions on the second plug interface surface (not shown) are pad-shaped and dimensioned to interact with conical shaped protrusions provided on a circuit board of an attachable electrical device.

For proper electrical connection, each conductive protrusion should be directly aligned with a mating conductive protrusion. Accordingly, it is desirable to fix the flex circuits 18, 32 in a manner that would ensure permanent alignment of the coupling conductive protrusions. In one embodiment, the first portion 20 of the receptacle flex circuit 18 is fixedly attached to the receptacle housing 16 using fasteners 42. Similarly, the first portion 34 of the plug flex circuit 32 is fixedly attached to the plug housing using fasteners 42, such that each of the conductive protrusions 28*c* on the first plug interface surface 36 is in fixed alignment with a corresponding conductive protrusion 28*a* on the first receptacle interface surface 22. In the preferred embodiment, the fasteners 42 are rivets. The first plug interface surface 36 preferably defines a plurality of bores 44, each housing a portion of fastener 42 that is protruding from the first receptacle interface surface 22. The utilization of bore 44 ensures that the protruding portion of fastener 42 will not interfere with the electrical contact between the conductive protrusions 28*a* on the first receptacle interface surface 22 and those on the first plug interface surface 36. Similarly, the first receptacle interface surface 22 preferably defines a plurality of bores 44, each housing the portion of fastener 42 protruding from the first plug interface surface 36. There is preferably one bore corresponding to each fastener used to fix the flex circuits 18, 32. In the preferred embodiment, the second receptacle interface surface 26 and the second plug interface surface are fixed in a manner similar to that described above.

Figure 7:
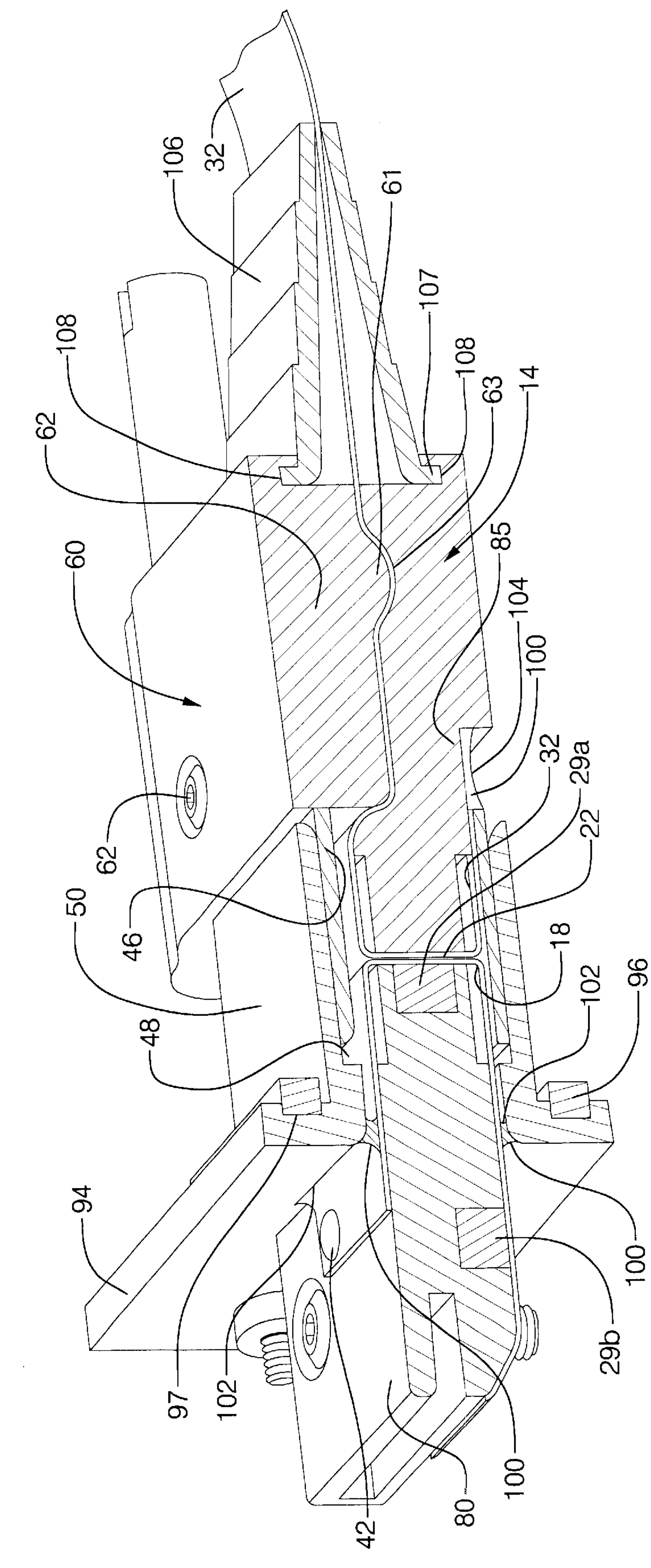
FIG. 7 is a section view over another embodiment of the plug and receptacle assemblies of the present invention in a connected state.
Figure 8:
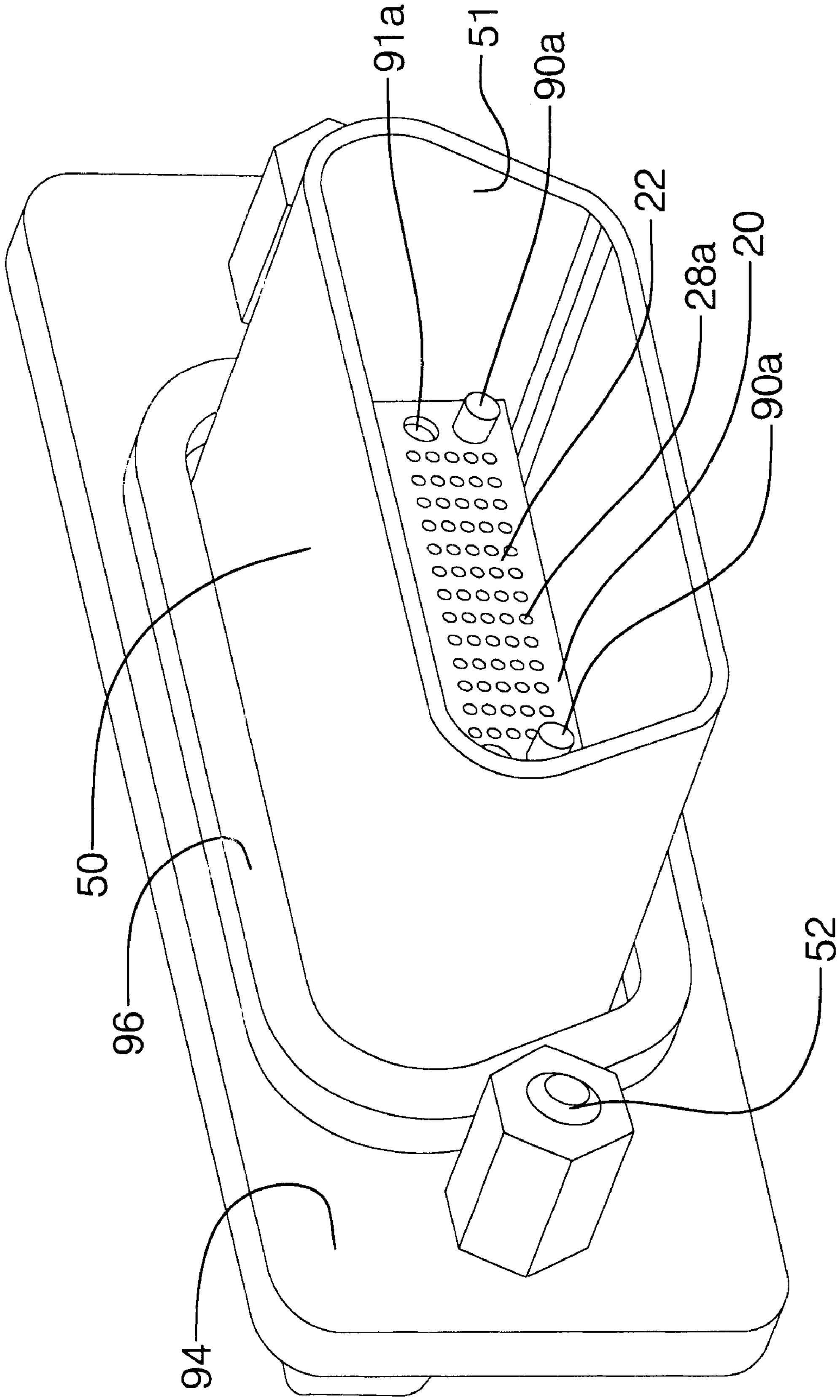
FIG. 8 is a partial perspective view of the receptacle of the embodiment shown in FIG. 7.
Figure 9:
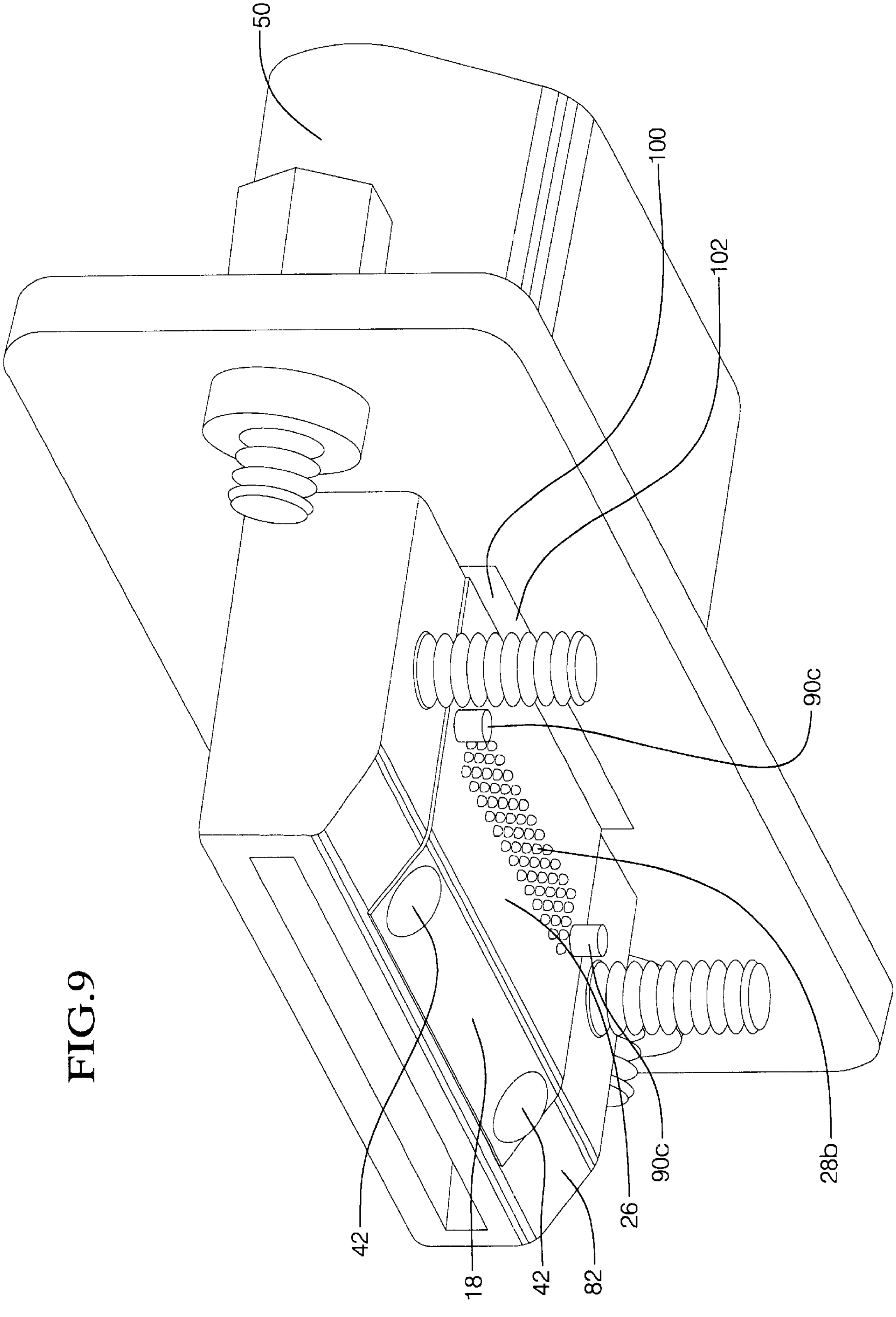
FIG. 9 is a perspective view of the rear portion of the receptacle used in the embodiment shown in FIG. 7.
Figure 10:
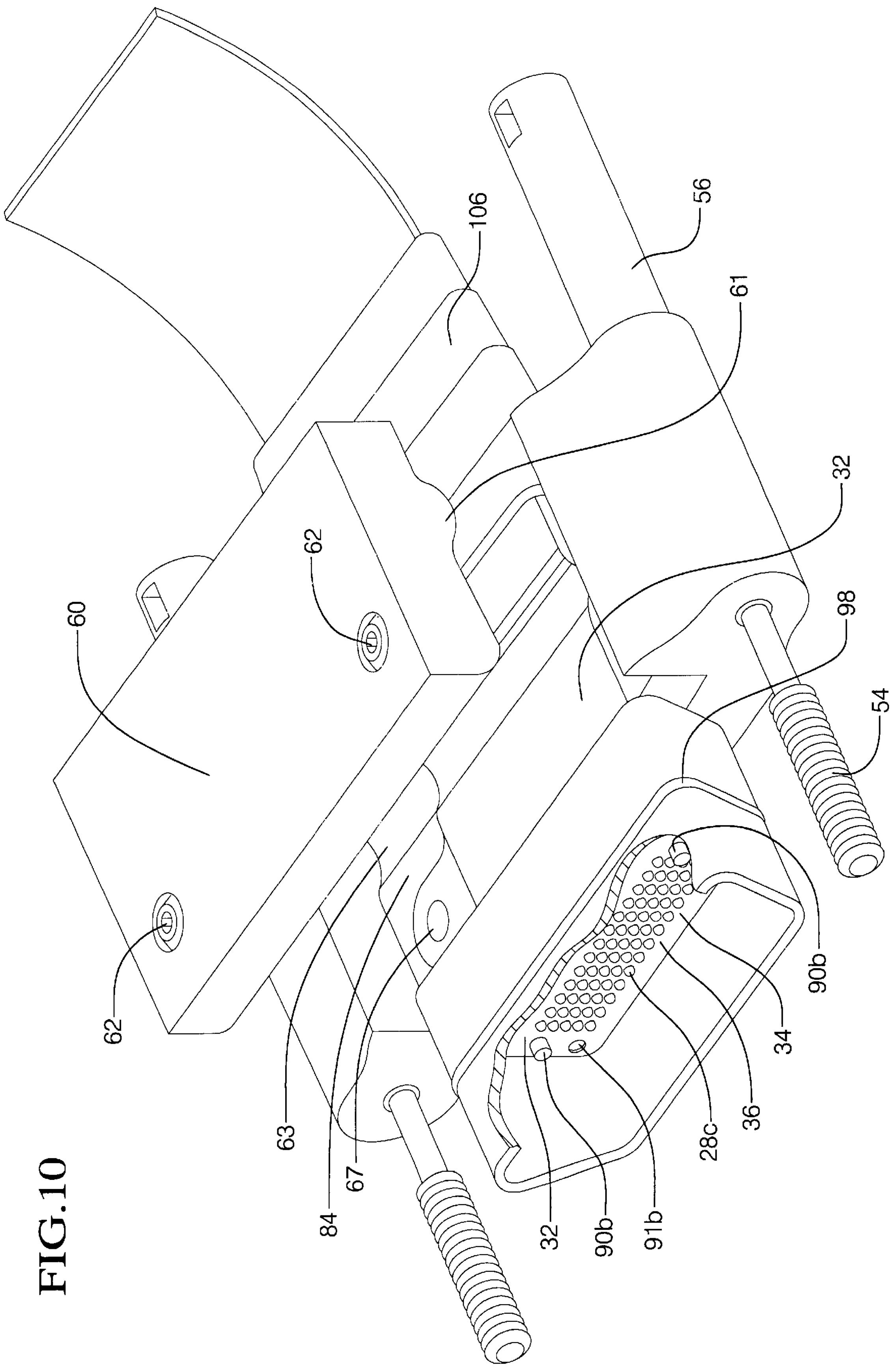
FIG. 10 is a perspective exploded view of the plug used in the embodiment shown in FIG. 7.

In another preferred embodiment shown in FIGS. 7–10, the flex circuits 18, 32 are fastened to the upper and lower surfaces of the receptacle and plug, respectively. For example, the flex circuit 32 is fastened to the upper surface 80 and lower surface 82 of the receptacle housing using rivets 42 as shown in FIGS. 7 and 9. Similarly the flex circuit 32 is attached to the upper surface 84 of the plug using fasteners 62 which are also used to attach a cover 60 to the plug as shown in FIGS. 7 and 10.

Fasteners (not shown) are used to attached the flex circuit to the lower surface 85 of the plug housing. With this embodiment, the flex circuit first portion 20 that defines the receptacle first interface surface comprises an alignment pin 90*a* extending from either side of the set of conductive protrusions 28*a* (FIG. 8). A hole 91*a* is formed adjacent each pin 90*a*. Similarly, pins 90*b* extend on either side of the set of conductive protrusions 28*c* from flex circuit 32 (FIG. 10). A hole 91*b* is formed adjacent each pin 90*b*. The holes 91*b* are positioned so as to receive pins 90*a*, while the holes 91*a* are positioned to receive pins 90*b* so as to finely align the conductive protrusions 28*a* with the conductive protrusions 28*c*. To accomplish the fine alignment, the fit between the pins 90*a*,90*b* and corresponding holes 91*b*, 90*a*, is a close tolerance fit. Instead of incorporating pins and holes at each flex circuit interface surface, one of the flex circuit interface surfaces, as for example the receptacle interface surface 22 may only have pins while the other flex circuit interface surface, as for example plug interface surface 36, may only have holes complementary to such pins so as to finely align the conductive protrusions of one flex circuit with the conductive protrusions of the other flex circuit during mating of the plug with the receptacle.

similarly pins 90*c* extend from either side of the set of conductive protrusions 28*b* (FIG. 9). When the receptacle is mated with the electrical circuit or flex board 27, the pins 90*c* are received by complementary holes (not shown) on the electrical circuit or flex board 27 to finely align the protrusions 28*b* with the circuit or flex board traces. Alternatively, the electrical circuit or flex board 27 may have pins and the flex circuit may have complementary holes. Moreover the flex circuit may have pins and holes, which are complementary to pins and holes formed on the electrical circuit a flex board.

The plug housing 30 has a lip 46 extending outward from the first plug interface surface 36 defining a non-symmetric enclosure and preferably D shaped enclosure surrounding the interface surface 36 (FIGS. 2, 3, 7 and 10). To further ensure proper alignment of the conductive protrusions 28*c* on the first plug interface surface 36 with the conductive protrusions 28*a* on the first receptacle interface surface 22, the lip 46 is dimensioned to fit into a channel 48 provided in the receptacle housing 16 surrounding the first receptacle interface surface 22. The receptacle housing 16 has a non-symmetric shaped enclosure and preferably a D shaped sleeve 50 extending outward from the first receptacle interface surface 22. The sleeve 50 surrounds the interface surface 22. The shape of the sleeve 50 is complementary to the shape defined by the lip 46 such that the sleeve 50 and lip 46 defined by lip 50 is complementary to the shape defined by sleeve 50. In this regard, one can fit within the other. Preferably however, the sleeve is dimensioned to snugly receive lip 46 of the plug assembly 14. The positioning of the plug lip 46 in the receptacle channel 48 combined with the placement of the sleeve 50 over the lip 46 of the plug assembly 14 ensures a secure fit of the plug assembly 14 into the receptacle assembly 16. The D shapes of the lip 46 and sleeve 50 provide for gross alignment of the plug and receptacle and allow the plug and receptacle to mate in one correct orientation, while the alignment pins 90*a*, 90*b* and holes 91*a*, 91*b* provide for fine alignment of the conductive protrusions.

The plug assembly 14 can preferably be fixedly attached to the receptacle assembly 16 using known fasteners. In the preferred embodiment, the receptacle housing 16 defines a pair of threaded bores 52, each dimensioned to receive a threaded portion 54 of the fastener 56. The fastener 56 is guided through a fastener channel 57 in the plug housing 14. When the fastener 56 is tightened, the threaded portion 54 of the fastener 56 mates with the threads of the bore 52, thereby fixedly attaching the plug assembly 14 to the receptacle assembly 12.

The receptacle housing 16 and plug housing 30 are preferably made from a metallic material, and more preferably metallic zinc. The metallic housings 16 and 30 provide shielding against electromagnetic and radio frequency interferences. By providing the metallic housings 16, 30, the need to individually shield each pin is eliminated. Thus, a more compact connector assembly can be designed. In an alternate embodiment, receptacle housing 16 and plug housing 30 could be composed of another material, as for example plastic, that is thereafter metallized. Shielding against electromagnetic interference (EMI) and radio frequency interference(RFI)can also be provided in the sleeve 50. In one embodiment, the sleeve 50 includes a flexible shielding portion 58 (FIGS. 2 and 3). The flexible shielding portion 58 is preferably made of a thin polyimide material that provides sufficient flexibility for the sleeve 50 to be expanded to accept the lip 46 of the plug assembly 14 and contracted to hold the plug assembly 14 firmly in place. When installed on the chassis 39, the shielding portion 58 engages the opening in the of the chassis into which the receptacle is fitted, consequentially providing a ground path for EMI/RFI shielding. The flexible shielding portion 58 of sleeve 50 is preferably metallized to attain its shielding capability.

In an alternate embodiment shown in FIGS. 7–10 the receptacle sleeve 50 extends from a flange portion 94 of the receptacle. A conductive metal filled rubber gasket 96 surrounds the sleeve 50 and is fitted within a groove 97 formed around the sleeve 50 on the flange 94 (FIG. 7). The rubber gasket is preferably a silver filled polymer. When the receptacle is mounted on the chassis 29, the rubber silver filled polymer is sandwiched between the flange 94 and the chassis 27. The conductive rubber gasket provides a ground path for EMIIRFI shielding. Moreover to provide a ground path between the lip 46 of the plug and the sleeve 50 of the receptacle, a spiral spring 98 is fitted in an annular groove formed around the lip 46. The spiral spring is a metallic spring and protrudes beyond the outer surface 47 of the lip 46. As such, as the lip 46 is inserted into the sleeve 50, the metallic spring 98 makes contact with the inner surface 51 of the sleeve 50. Moreover, in a preferred embodiment all the open paths to the flex circuit are sealed using an EMI/RFI potting material which is preferably a caulking type of compound containing silver particles. For example, the gap 102 which allows the flex circuit 18 to wrap around the receptacle is filled with the EMI/RFI potting 100 as shown in FIGS. 7 and 9. Moreover, the gap 104 in the plug as shown in FIGS. 7 and 9 is also filled with EMI/RFI potting 100 so as to shield the flex circuit 32 from EMIlRFI. Moreover, by incorporating flex circuits which include a layer of copper and by attaching such flex circuits to the metallic or metallized receptacle and plug housings using metallic fasteners such as rivets, a continuous electrical path is provided from the flex circuits to the receptacle and plug housings which provide for an electrical path to the chassis 39 on which the receptacle is mounted thereby providing for 100% EMI/RFI shielding. In a preferred embodiment as shown in FIGS. 7–10, a rubber boot 106 is coupled to the rear surface of the plug 14. The rubber boot 106 has an annular lip 107 which is fitted into grooves 108 formed on the plug 14 and plug cover 60 as shown in FIG. 7. The flex circuit 32 extending externally from the plug is fitted through the boot. Consequently, the boot prevents the sharp bending of the flex circuit 32 as it extends outwardly from the plug.

Figure 6:
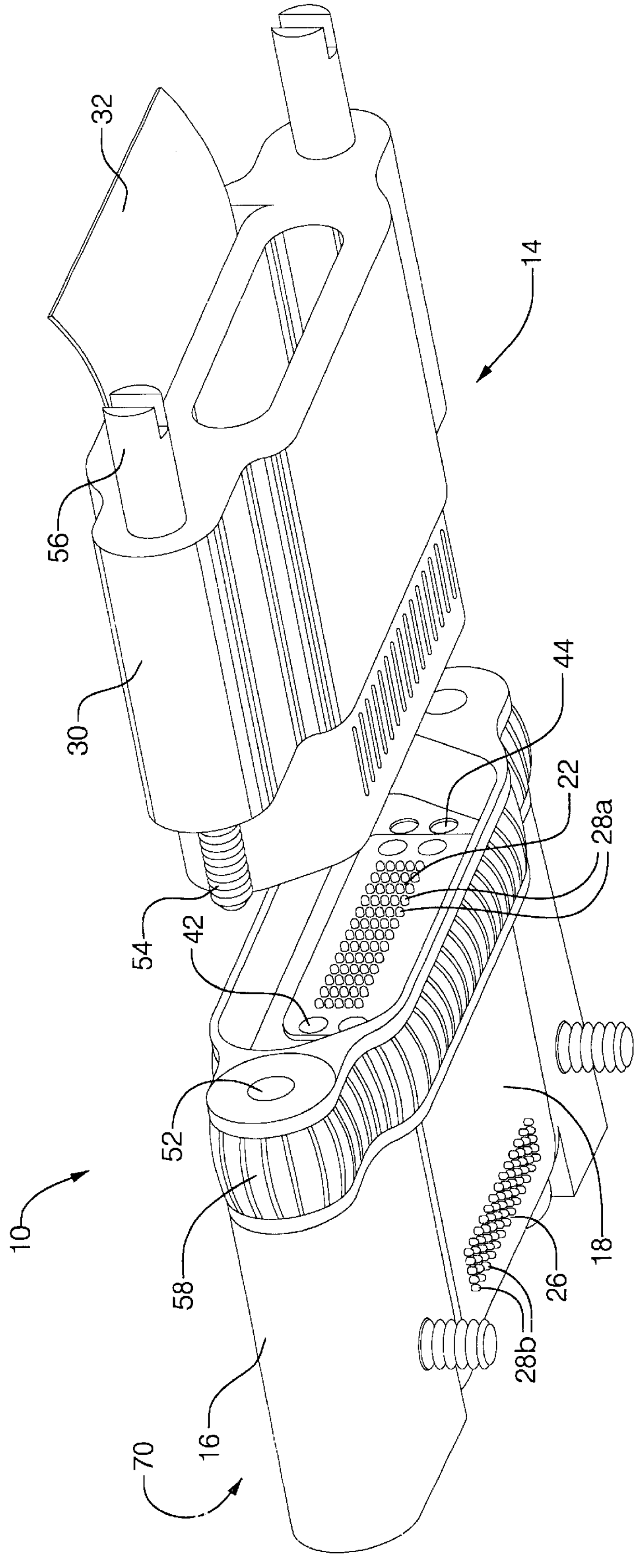
FIG. 6 is an elevated perspective view of the plug and receptacle assemblies of another embodiment of the present invention in an unconnected state.

As best shown in FIGS. 5 and 10, to facilitate the installation of the plug flex circuit 32 in the plug assembly 14, the plug housing 30 is provided with a cover 60. The cover 60 is attachable to the plug housing 30 using fasteners 62. In the preferred embodiment, fasteners 62 are threaded bolts that mate with corresponding threaded bores 64 in the plug housing 30. The cover 60 has a protruding portion 61 (FIGS. 1 and 10) which is typically as long or even slightly longer than the width of the flex circuit 32. The plug housing has a depression 63 (FIGS. 1 and 10) which is complementary to the protruding portion 61. When attached to the plug housing, the protruding portion 61 of cover 60 sandwiches the flex circuit 32 against the depression 63. In essence, the flex circuit 32 is clamped between the protruding portion 61 and the depression 63. Consequently, this clamping provides strain relief to the flex circuit, in that it physically isolates the first portion 34 of the flex circuit forming the plug interface surface 36 from the portion 65 of the flex circuit which extends externally of the plug housing. In this regard, an accidental pull on the external potion 65 of the flex circuit will be reacted at the location of the clamping and not at the flex circuit first portion 34. Further strain relief is provided by the fastening of the flex circuit 32 to the upper surface 84 using fasteners 62 as shown in the embodiment disclosed in FIG. 10. Consequently, an accidental pull on the flex circuit will be reacted against the fasteners 62, thereby presenting movement of the flex circuit first portion 34. The receptacle assembly 12 and plug assembly 14 can be dimensioned and designed to apply to various applications. For example, in the embodiment of the invention shown in FIGS. 1 through 5, the receptacle assembly has a Z-shape to accommodate an electrical connection for a circuit board that is positioned at a distance from the plug assembly 14. As best shown in FIG. 4, the first receptacle interface surface 22 is not directly attached to the second receptacle interface surface 26. Rather, the first receptacle interface surface 22 is attached to a first extension 66 which is, in turn, attached to a second extension 68. The second extension 68 is attached to the second receptacle interface surface 26. While the first receptacle interface surface 22 remains electrically connected to the second receptacle interface surface 26, the first receptacle interface surface 22 does not directly contact the second receptacle interface surface 26. In the embodiment shown in FIG. 4, the first receptacle interface surface 22 connects to the first extension 66, preferably at a perpendicular angle and the first extension 66 connects to the second extension 68, preferably at a perpendicular angle. Finally, the second extension 68 connects to the second receptacle interface surface 26, preferably at a perpendicular angle. The first and second receptacle interface surfaces 22, 26 and the first and second extensions 66, 68 are all an integral part of a continuous receptacle flex circuit 18. However, the shape of the receptacle housing 16 and the particular bending of the receptacle flex circuit 18 allow for the connection of the flex connector assembly 10 to an electrical board positioned at a distance from the plug assembly 12. An alternative design for the flex connector assembly 10 is shown in FIG. 6. As shown in FIG. 6, the plug assembly 14 is the same as that described in the previous embodiment. However, FIG. 6 shows a receptacle assembly 70 having an in-line design, as described more fully below.

Like the previous embodiment, the in-line receptacle assembly 70 includes a receptacle housing 16, a receptacle flex circuit 18 having conductive protrusions **28*a* on a first receptacle interface surface 22 and conductive protrusions 28*b* on a second receptacle interface surface 26. The in-line receptacle assembly 70, however, is designed to connect with an electrical board that is positioned closer to the plug assembly 14. Hence, there is no need for any extension pieces. The first receptacle interface surface 22 connects directly with the second receptacle interface surface 26. In the embodiment shown, the first receptacle interface surface 22 is perpendicular to the second receptacle interface surface 26. A further alternate embodiment having an in line design is the embodiment depicted in FIG. 7** and described herein.

While the invention is disclosed in conjunction with specific embodiments thereof, it is to be evident that many alternatives, modifications, and variations will be apparent to those skilled in the art in light of the foregoing description. Accordingly, it is intended to embrace all such alternatives, modifications and variations as falling within the spirit and broad scope of the appended claims.

What is claimed is:

1. A flex connector assembly, comprising:

a plug assembly having a plug housing and a plug flex circuit coupled to the plug housing, the plug flex circuit having a first portion with a plurality of conductive points arranged in a two-dimensional array thereon defining a first plug interface surface, said flex circuit extending through and beyond the plug housing and terminating with a second set of conductive points spaced apart from the plug housing;

a receptacle assembly having a receptacle housing and a receptacle flex circuit coupled to the receptacle housing, the receptacle flex circuit having a first portion with a plurality of conductive points arranged in a two-dimensional array thereon defining a first receptacle interface circuit;

wherein each of the conductive points of the plug assembly are aligned to contact one of the conductive points of the receptacle assembly when the plug assembly and receptacle assembly are in a connected state, thereby electrically coupling each of the conductive points of the plug assembly with one of the conductive points of the receptacle assembly, said alignment is controlled in part by a first pair of gross alignment members for roughly moving the plug housing and the receptacle assembly to close mating proximity and by first and second alignment members for finely aligning the conductive points of the plug assembly with the conductive points of the receptacle assembly.

2. The flex connector assembly according to claim 1 wherein the conductive points of the plug assembly are pad-shaped.

3. The flex connector assembly according to claim 1 wherein the conductive points of the receptacle assembly are cone-shaped.

4. The flex connector assembly according to claim 1 wherein the conductive points of the plug and receptacle assemblies comprise copper.

5. The flex connector assembly according to claim 1 wherein the conductive points of the plug and receptacle assemblies comprise gold.

6. The flex connector assembly according to claim 1 wherein the plug housing comprises a metallic material and wherein the receptacle housing comprises a metallic material.

7. The flex connector assembly according to claim 1 wherein the receptacle assembly comprises a sleeve having a length extending along a path from the receptacle housing, wherein the sleeve is dimensioned to receive and hold the plug housing.

8. The flex connector assembly according to claim 7 wherein the plug housing comprises a lip having a length and wherein the receptacle assembly defines a channel surrounding the first receptacle interface surface dimensioned to receive the lip of the plug housing.

9. The flex connector according to claim 8 further comprising a flexible shield surrounding the sleeve, wherein the flexible shield allows for expansion of the sleeve when receiving the lip and for contraction of the sleeve for holding the received lip in place.

10. The flex connector according to claim 9 wherein the flexible shield is made from polyimide.

11. The flex connector according to claim 8 wherein the receptacle assembly defines a flange at the intersection of the sleeve and the receptacle assembly, and wherein the flex connector further comprises a metal filled rubber gasket coupled to the flange and surrounding the sleeve.

12. The flex connector according to claim 11 wherein the gasket is a silver filled rubber polymer.

13. The flex connector as recited in claim 8 wherein the plug further comprises a metallic spring surrounding the lip, wherein such metallic spring is sandwiched between the lip and sleeve when the plug and receptacle are in a connected state.

14. The flex connector assembly as recited in claim 8 wherein the sleeve is not symmetric about any plane extending along the sleeve length.

15. The flex connector assembly according to claim 14 wherein the shape of the lip is complementary to the shape of the sleeve.

16. The flex connector as recited in claim 15 wherein the sleeve comprises a generally D shape.

17. The flex connector assembly according to claim 1 wherein the plug assembly is securely fixed to the receptacle assembly using fasteners.

18. The flex connector assembly according to claim 1 wherein the plug flex circuit is fastened to the plug housing with conductive fasteners.

19. The flex connector assembly according to claim 1 wherein the receptacle flex circuit is fastened to the receptacle housing with conductive fasteners.

20. The flex connector assembly according to claim 1 wherein the receptacle flex circuit has a second portion with a plurality of conductive points thereon defining a second receptacle interface surface.

21. The flex connector assembly according to claim 20 wherein the first receptacle interface surface is perpendicular to the second receptacle interface surface.

22. The flex connector assembly according to claim 1 wherein the plug flex connector comprises a second portion that is electrically connectable to an electric circuit.

23. The flex connector assembly according to claim 22 further comprising a resilient boot coupled to the plug assembly and surrounding a section of the second portion of the plug flex connector.

24. The flex connector assembly according to claim 1 further comprising:

two holes formed on the first portion of the plug flex circuit; and two alignment pins extending from the first portion of the receptacle flex circuit for penetrating the holes formed on the first portion of the plug flex circuit.

25. The flex connector assembly according to claim 1 further comprising:

two holes formed on the first portion of the receptacle flex circuit; and two alignment pins extending from the first portion of the plug flex circuit for penetrating the holes formed on the first portion of the receptacle flex circuit.

26. The flex connector assembly according to claim 1 further comprising:

two holes formed on the first portion of the plug flex circuit;

two alignment pins extending from the first portion of the plug flex circuit;

two holes formed on the first portion of the receptacle flex circuit for accommodating the alignment pins extending from the first portion of the plug flex circuit; and two alignment pins extending from the first portion of the receptacle flex circuit for penetrating the holes formed on the first portion of the plug flex circuit.

27. The flex connector assembly according to claim 24, 25, or 26 further comprising:

a sleeve extending from the receptacle housing;

a lip complementary to the sleeve extending from the plug housing, wherein the lip engages the sleeve during mating of the plug and receptacle assemblies, wherein the sleeve and lip have shapes which are not symmetric about any plane along the lip length dividing the sleeve and lip in half.

28. The flex connector assembly as recited in claim 1 further comprising:

a groove formed on the receptacle assembly housing behind the first receptacle interface surface; and an elastomer fitted in the groove.

29. A connector assembly comprising a plug assembly and a receptacle assembly;

the plug assembly further comprising a plug housing and a flex circuit, the flex circuit is attached to the plug housing at a flex circuit first end and extends through and beyond the plug housing and terminating in a flex circuit second end, which is spaced apart from the plug housing; the plug housing further comprising a lip which is located proximate the flex circuit first end, and both the flex circuit first end and second end comprising an array of conductive points;

the receptacle assembly further comprising a receptacle housing, the receptacle housing comprising a channel and a flex circuit; the flex circuit is attached to the receptacle housing at a flex circuit first end and a flex circuit second end, the flex circuit first and second ends comprising an array of conductive points and wherein the two array of conductive points are substantially perpendicular to one another; and wherein the lip and the channel are configured to facilitate alignment and orientation when the plug housing is mated with the receptacle housing.

* * * * *